United States Patent [19]

Beauregard et al.

[11] Patent Number: 5,126,511
[45] Date of Patent: Jun. 30, 1992

[54] COPPER CORED ENCLOSURES FOR HYBRID CIRCUITS

[75] Inventors: Robert E. Beauregard, Lincoln; Joseph M. Gondusky, Warwick, both of R.I.; Henry F. Breit, Attleboro, Mass.

[73] Assignee: Texas Instruments Incorporated, Dallas, Tex.

[21] Appl. No.: 640,796

[22] Filed: Jan. 14, 1991

Related U.S. Application Data

[62] Division of Ser. No. 365,631, Jun. 13, 1989, Pat. No. 5,036,584.

[51] Int. Cl.5 ............................................. H01L 23/02
[52] U.S. Cl. ...................................... 174/52.4; 357/74
[58] Field of Search ................... 174/52.3, 52.4, 52.5; 357/74, 70; 361/386, 390, 421

[56] References Cited

U.S. PATENT DOCUMENTS

| | | | |
|---|---|---|---|
| 4,229,758 | 10/1980 | Ikari | 357/74 |
| 4,506,108 | 3/1985 | Kersch et al. | 174/52.4 |
| 4,902,854 | 2/1990 | Kaufman | 174/52.4 |
| 4,922,324 | 5/1990 | Sudo | 357/74 |
| 5,001,299 | 3/1991 | Hingorany | 174/52.4 |

Primary Examiner—Leo P. Picard
Assistant Examiner—Bot L. Ledynh
Attorney, Agent, or Firm—Russell E. Baumann; Richard L. Donaldson; René E. Grossmann

[57] ABSTRACT

A method of forming an enclosure for an electric circuit and the enclosure wherein there is provided a boat of material having a bottom and side wall, placing a material having a substantially higher thermal conductivity and a lower melting point than that of the boat in the boat bottom, heating the material to a temperature above the melting point thereof and below the melting point of the boat to cause the material to flow along the bottom to form a layer of the material thereon and join the layer to the bottom and side wall and removing a sufficient amount of the bottom of said boat to expose the layer. In accordance with a second embodiment, a depression is formed in the bottom, and when the material flows along the bottom, it fills the depression and becomes joined to the bottom. Plural such depressions can be provided. The exterior portion of the bottom is removed to expose the material if the depressions do not extend completely through the bottom. In accordance with a third embodiment, a block of metal with a hole therethrough is provided, and filled with a material having a higher thermal conductivity than the block of metal and a melting point below that of the block of metal. The block of metal with material therein is heated to a temperature between the melting point of the material and the block of metal to fill the hole with the metal and join the metal to the block of material. The block is formed into plural smaller blocks and a side wall and a cover are formed around the filled hole.

13 Claims, 2 Drawing Sheets

COPPER CORED ENCLOSURES FOR HYBRID CIRCUITS

This application is a division of application Ser. No. 365,631, filed Jun. 13, 1989 now U.S. Pat. No. 5,036,584.

BACKGROUND OF THE INVENTION

1. Field of the Invention

This invention relates to enclosures for hybrid circuits and methods of manufacture of such enclosures.

2. Brief Description of the Prior Art

Hybrid electrical circuits, especially such circuits of the chip and wire hybrid type, require the protection of a sealed package or enclosure. The function of the hybrid circuit enclosure is to house and protect a ceramic hybrid circuit, either thick-film or thin-film, by providing a hermetically sealed environment for such circuit. The standard enclosures of the above noted type are fabricated from solid metal (i.e., Kovar, metal alloy ASTM F-15 and the like) which is preferred for glass (low expansion) sealing of insulated through-wall electrical connection leads. Kovar is a registered trademark of Westinghouse Electric Company and the well-known Kovar alloy comprises a cobalt-iron-nickel metal alloy having a composition of nickel 23–30 percent, cobalt 30–17 percent, manganese 0.6–0.8 percent, and the balance iron as is set forth in A Dictionary of Metallurgy, A. D. Merriman, 1958, MacDonald and Evans Ltd., Publisher, London. Several fabrication methods have been used, these including machining of a boat from a solid block of metal, brazing metal walls to a metal base and stamping of the boat shape from the metal being used. Holes are then punched or drilled in the bottom and/or side walls for vertical and/or horizontal pin-outs, as required Glass is then used in the holes in conjunction with the Kovar alloy conductor pins or leads to hermetically seal the leads in the walls of the enclosure after heating to an appropriate temperature.

The prior art of hybrid electric circuit packages and enclosures is set forth in detail in "Power Hybrids Aid HF Supply Design", by Dennis Buchenholz, PCIM, October, 1988, pages 68 to 70, "Hybrid Packages Maximize Circuit Protection" by Howard W. Markstein, Electronic Packaging & Production, January 1989, pages 48 to 51 and "Designing Power Hybrid Packages" by Al Krum, Hybrid Circuit Technology, March, 1989, pages 17 to 24.

The enclosure must also offer efficient heat dissipation, hermeticity minimum size and a reliable means of connection to an external device, such as a printed circuit board.

As is readily apparent from the prior art, when high power devices are mounted inside the hybrid enclosures or packages, either directly on the package material or on a substrate between the device and the enclosure, a high thermal conductivity enclosure material is required to dissipate the heat generated by the electrical circuit. It is also required that this material have a low coefficient of thermal expansion to avoid cracking or other damage to the electrical circuit.

One standard solution to this problem in the past has been to utilize a Kovar alloy ring and braze it to a specialty material i.e., molybdenum, copper-tungsten, copper-molybdenum-copper, clad sheet materials, etc.) which is used as the base material onto which the electrical circuit is affixed.

The above described solution has several disadvantages, among them being high cost of the solid base specialty material, the difficulty in brazing of joints of dissimilar metals (i.e., molybdenum to copper) and the requirement that the leads or pins be confined to the Kovar alloy sidewalls of the enclosure in order to maintain hermeticity in conjunction with the glass seal.

It is generally known that an effective hybrid enclosure must have a base which displays high thermal conductivity to transfer heat from the electrical hybrid circuit which is secured thereto to the enclosure exterior through the bottom. It is also highly desirable that the enclosure base simultaneously have a controlled, preferably low, coefficient of thermal expansion which matches the coefficient of thermal expansion of the substrate (usually a ceramic material) of the hybrid circuit to be secured within the enclosure. This prevents or minimizes cracking of the substrate of the hybrid circuit due to thermal cycling or thermal shock. It is further desirable that the lid for the enclosure be hermetically weldable to the sidewalls thereof, generally such as by seam welding or other techniques. This is difficult with, for example, copper sidewalls. A still further desirable feature is that there be matched seals as opposed to compression seals to provide the required hermeticity wherein the expansion properties of the glass sealant is matched to the metal forming the enclosure portion where the seal is to be formed. Kovar is the desired material for thermal matching with glass sealant. A yet further desired property is flexural strength of the base of the enclosure to minimize bowing thereof and thereby minimizing the likelihood of the electrical circuit substrate separating from the base or cracking and decreasing thermal conductivity between substrate and base. A still further consideration is economics which is always present. It is therefore readily apparent that the materials of choice, if displaying the required properties, are copper, steel, aluminum and the like which are relatively inexpensive. A yet further consideration is the ability to provide leads or pins through the enclosure both vertically and horizontally. This requires that all surfaces of the enclosure which will retain such leads or pins have the property of sealing hermetically to the bonding material, generally glass. The prior art has long sought but has been unable to provide enclosures for hybrid electrical circuits which meet all of the above criteria.

SUMMARY OF THE INVENTION

In accordance with the present invention, there is provided an enclosure for hybrid electrical circuits comprising: (a) a housing of metal material having a bottom and sidewall integral with each other, said bottom having an aperture defined therein, (b) a metal material having high thermal conductivity relative to said housing material disposed in said aperture and joined to said housing, and (c) a cover forming a top of said housing joined to said housing, and a method of making same which embodies the above noted criteria Briefly, in accordance with a first embodiment of the invention, a solid block of Kovar alloy is machined into a boat shape as in the prior art and a hole of predetermined shape and dimension is then cut either partially through or entirely through the base of the boat. A piece of copper is then placed in the aperture, the boat and copper are placed in a furnace under a protective and/or reducing atmosphere and the furnace is then heated to or above the melting point of the copper and below the melting point of the Kovar alloy. The copper will flow to fill the aperture and self-braze or wet to the Kovar alloy in contact therewith. Any copper in excess of the volume of the aperture will flow over the inner surface of the boat and also self-braze or wet thereto. Any copper not in the aperture can then be machined away entirely or in part to provide a Kovar alloy boat with a copper slug portion in the base thereof which is self-brazed or wetted to the Kovar alloy. In the event the copper does not extend entirely through the base of the Kovar alloy boat, the bottom portion of the boat is machined away until the copper portion extends to and is exposed at the bottom portion of the boat. High reliability glass to metal seals can then be place through either or both of the sidewalls and kovar portion of the bottom for hermetic retention of pins or the like by melting the glass at about 1000° C., this being below the melting point of copper. The package can then be plated with nickel and/or gold to provided the completed package without a top. After the hybrid electrical circuit is secured to the base of the enclosure and wires connected between the pins in the enclosure walls and the electrical circuit, a Kovar alloy top is secured to the kovar side walls in standard manner using welding or soldering.

It is noted that the copper is completely surrounded by Kovar alloy which is flexurally strong and that the Kovar alloy prevents the copper from expanding to the degree it would if not surrounded by the Kovar alloy. This property of the copper is further improved by providing many small apertures in the Kovar alloy base for receiving the copper rather than one large aperture as discussed hereinabove.

DESCRIPTION OF THE PREFERRED EMBODIMENTS

Referring first to FIGS. 1a to 1e, there is shown a first embodiment in accordance with the present invention comprising: (a) a housing of metal material having a bottom and sidewall integral with each other, said bottom having an aperture defined therein, (b) a metal material having high thermal conductivity relative to said housing material disposed in said aperture and joined to said housing, and (c) a cover forming a top of said housing joined to said housing.

Figure 1A:
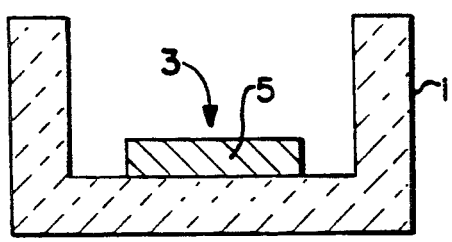
FIGS. 1a to 1e depict the process steps required to form an enclosure in accordance with a first embodiment of the present invention.
Figure 1B:
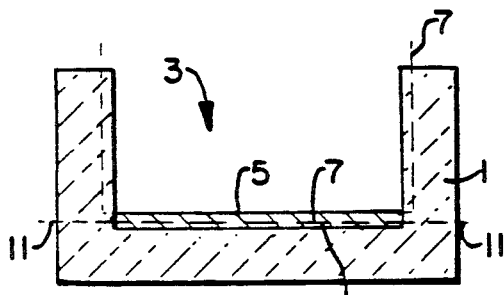
Figure 1C:
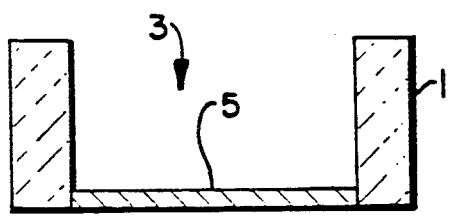
Figure 1D:
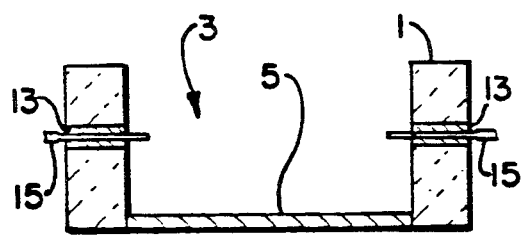

As shown in FIG. 1a, a solid block of Kovar alloy is machined into a boat shape 1 as in the prior art and a hole or aperture 3 of predetermined shape and dimension is then cut either partially through or entirely through the base of the boat. A piece of copper 5 in the form of a slug or the like is then placed in the aperture 3, the boat 1 with copper therein are placed in a furnace under a protective atmosphere of dry nitrogen and the furnace is then heated to or above the melting point of the copper which is 1047 degrees C. and below the melting point of the Kovar alloy which is 1450 degrees C. As shown in FIG. 1b, the copper 5 will then flow to fill the aperture and self-braze or wet to the Kovar alloy in contact therewith. The copper is then cooled and is cast in place. The Kovar alloy portion of the boat is then machined around the aperture 3 along the vertical lines 7 to below the top surface of the copper and the copper is then machined away along the horizontal line 9 to provide a clean copper surface within the boat. The Kovar alloy boat 1 is also machined along the horizontal line 11 to expose a region of copper at the bottom of the boat as shown in FIG. 1c. High reliability glass to metal seals 13 are then placed through either or both of the sidewalls and Kovar alloy portion of the bottom of electrically conducting terminals or the boat 1 for hermetic retention of pins 15 or the like by melting the glass having a coefficient of thermal expansion substantially the same as the material of the side wall, the glass being melted at about 1000 degrees C., this being below the melting point of copper as shown in FIG. 1d. The package can then be plated with nickel and/or gold to provide the completed package without a top. After the hybrid electrical circuit is secured to the base of the enclosure and wires 17 connected between the pins in the enclosure walls and the hybrid electrical circuit 19, a Kovar alloy top 21 is secured to the Kovar alloy side walls in standard manner using welding or soldering.

Figure 2A:
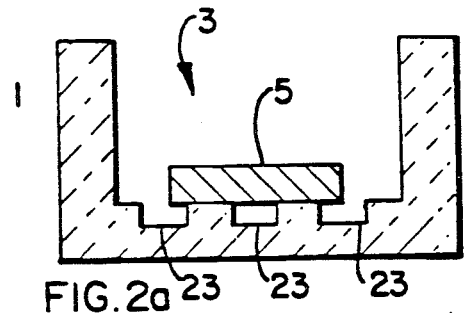
FIGS. 2a to 2e depict the process steps required to form an enclosure in accordance with a second embodiment of the present invention.
Figure 2B:
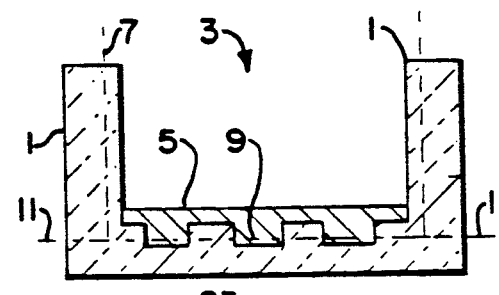
Figure 2C:
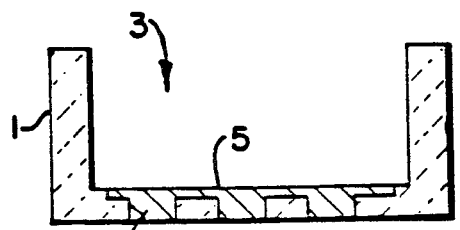
Figure 2D:
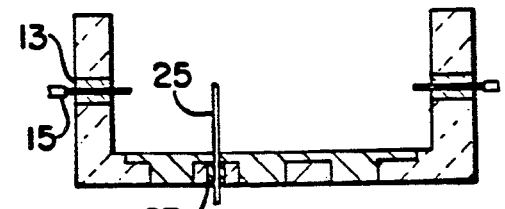
Figure 1E:
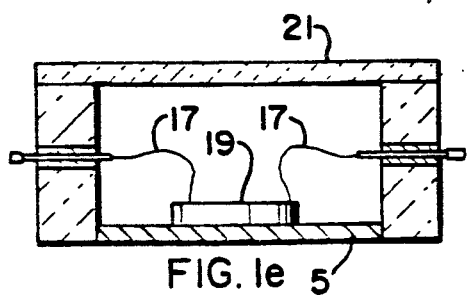
Figure 2E:
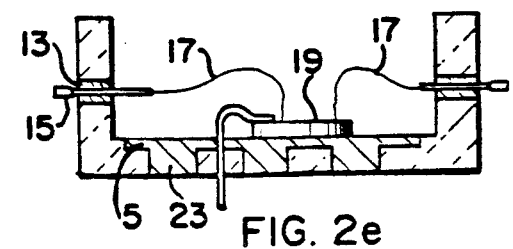

Referring now to FIGS. 2a to 2e, there is shown a second embodiment of the invention wherein like reference numbers refer to like parts as in FIG. 1. In this embodiment, the procedure is as in FIG. 1 except that plural apertures 23 are formed in the bottom of the aperture 3 prior to introduction of the copper slug 5 as shown in FIG. 2a. Accordingly, upon heating to the melting point of the copper or above, the apertures 23 as well as a portion of the boat interior above the apertures 23 is filled with the melted and later solidified copper as shown in FIG. 2b. Machining then takes place along the vertical line 7 and the horizontal line 9. However, when machining then takes place along the line 11, plural smaller sections of copper are exposed in the apertures 23 between the Kovar alloy sections as shown in FIG. 2c. In this embodiment, since Kovar alloy is present in portion of the boat bottom, a pin 25 with hermetic seal 27 identical to those in the sidewalls can also be placed through the bottom as shown in FIG. 2d. Accordingly, as shown in FIG. 2e, connection is made from the electrical circuit 19 to all of the pins 15 and 25.

As a still further embodiment, the embodiment of FIG. 2a to 2e is altered by providing one or more apertures 23 and then machining along the horizontal line 9 wherein the horizontal line 9 is disposed so that it passes through the aperture or apertures 23. In this manner, all copper 5 is removed from the interior bottom portion of the boat with copper being disposed only in the apertures 23 as shown in FIG. 3.

Figure 3:
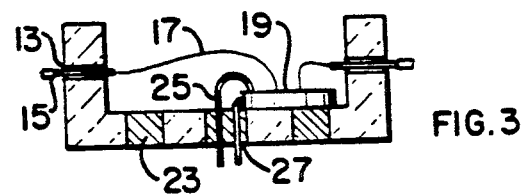
FIG. 3 is a diagram of an enclosure in accordance with a third embodiment of the present invention.
Figures 4A, 4B, 4C:
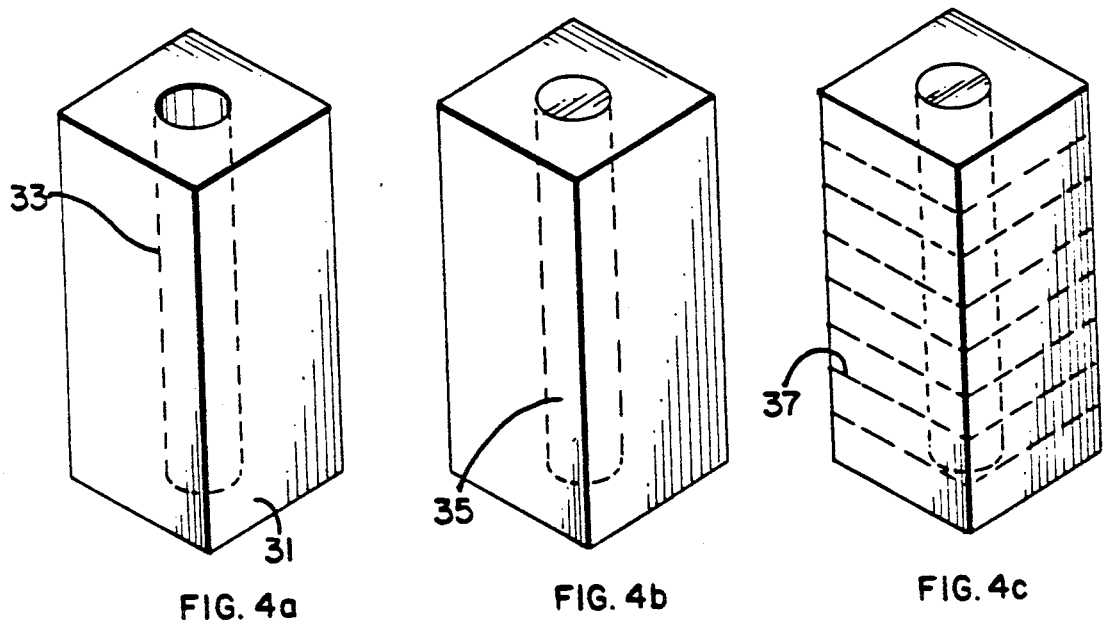
FIGS. 4a to 4d depict the process steps required to form an enclosure in accordance with a fourth embodiment of the present invention.
Figure 4D:
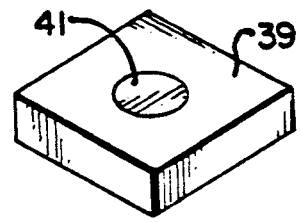

It should be understood that in the case of each of the embodiments of FIGS. 1 to 3, the sidewall can be of the same or different material from that of the base or bottom with the bottom being joined to the sidewalls as in the prior art. Otherwise, the procedure is the same as described hereinabove.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. An enclosure for electrical circuits comprising:
   (a) a housing of metal material having a low coefficient of thermal expansion and having a bottom and side wall integral with each other, said bottom having an aperture defined therein,
   (b) a copper metal material having a high thermal conductivity relative to the material of said housing disposed in said aperture and joined by self-brazing to said housing, and
   (c) a cover forming a top of said housing joined to said housing.

2. An enclosure as set forth in claim 1 wherein said side wall is formed from Kovar alloy, and said cover is formed of Kovar alloy and welded to said side wall.

3. An enclosure as set forth in claim 2 wherein a portion of said bottom is formed of the same material as said side wall.

4. An enclosure as set forth in claim 3, further including plural said apertures in said bottom, each of said apertures having said copper metal material having a high thermal conductivity relative to said housing disposed therein and joined by said self-brazing to said portion of said bottom of the same material as said side wall.

5. An enclosure as set forth in claim 4 further including an electrically conducting terminal extending through said side wall and sealed thereto by a glass seal material having a coefficient of thermal expansion substantially the same as the material of said side wall and having a melting temperature less than the copper material of high thermal conductivity.

6. An enclosure for electrical circuits comprising:
   (a) a housing having a bottom and side wall integral with each other, said bottom having an aperture defined therein,
   (b) a material having a high thermal conductivity relative to said housing disposed in said aperture and joined to said housing, and
   (c) a cover forming a top of said housing joined to said housing, said side wall being formed of Kovar and said material having a high thermal conductivity being copper, said enclosure further including an electrically conducting material extending through said side wall and sealed thereto by a material having a coefficient of thermal expansion substantially the same as the material of said side wall.

7. An enclosure for electrical circuits comprising:
   (a) a housing having a bottom and side wall integral with each other, said bottom having an aperture defined therein,
   (b) a material having a high thermal conductivity relative to said housing disposed in said aperture and joined to said housing, and
   (c) a cover forming a top of said housing joined to said housing, said cover being formed of Kovar and welded to said side wall, said enclosure further including an electrically conducting terminal extending through said side wall and sealed thereto by a material having a coefficient of thermal expansion substantially the same as the material of said side wall.

8. An enclosure for electrical circuits comprising:
   (a) a housing having a bottom and side wall integral with each other, said bottom having an aperture defined therein,
   (b) a material having a high thermal conductivity relative to said housing disposed in said aperture and joined to said housing, and
   (c) a cover forming a top of said housing joined to said housing, a portion of said bottom being formed of the same material as said side wall, said enclosure further including an electrically conducting terminal extending through said side wall and sealed thereto by a material having a coefficient of thermal expansion substantially the same as the material of said side wall and an electrically conducting terminal extending through the portion of said bottom of the same material as said side wall and sealed thereto by a material having a coefficient of thermal expansion substantially the same as the material of said side wall.

9. An enclosure for electrical circuits comprising:
   (a) a housing having a bottom and side wall integral with each other, said bottom having a portion formed of the same material as said side wall and having an aperture defined therein,
   (b) a material having a high thermal conductivity relative to said housing disposed in said aperture and joined to said housing, and
   (c) a cover forming a top of said housing joined to said housing, said side wall being formed of Kovar and said material having a high thermal conductivity being formed of copper, said enclosure further including an electrically conducting terminal extending through said side wall and sealed thereto by a material having a coefficient of thermal expansion substantially the same as the material of said side wall and an electrically conducting terminal extending through the portion of said bottom of the same material as said side wall and sealed thereto by a material having a coefficient of thermal expansion substantially the same as the material of said side wall.

10. An enclosure for electrical circuits comprising:
    (a) a housing having a bottom and side wall integral with each other, said bottom having a portion formed of the same material as said side wall and having an aperture defined in the bottom,
    (b) a material having a high thermal conductivity relative to said housing disposed in said aperture and joined to said housing, and
    (c) a cover forming a top of said housing joined to said housing, said cover being formed of Kovar and welded to said side wall, said enclosure further including an electrical conducting terminal extending through said side wall and sealed thereto by a material having a coefficient of thermal expansion substantially the same as the material of said side wall and an electrically conducting terminal extending through the portion of said bottom of the same material as said side wall and sealed thereto by a material having a coefficient of thermal expansion substantially the same as the material of said side wall.

11. An enclosure for electrical circuits comprising:
    (a) a housing having a bottom and side wall integral with each other, said bottom having a portion formed of the same material as said side wall and having a plurality of apertures therein,
    (b) a material having a high thermal conductivity relative to said housing disposed in said apertures and joined to said portion of said bottom of the housing of the same material as said side wall, and (c) a cover forming a top of said housing joined to said housing, said side wall being formed of Kovar and said material having a high thermal conductivity being copper, said cover being formed of Kovar and welded to said side wall, and said enclosure further including an electrically conducting terminal extending through said side wall and sealed thereto by a material having a coefficient of thermal expansion substantially the same as the material of said side wall and an electrically conducting terminal extending through the portion of said bottom of the same material as said side wall and sealed thereto by a material having a coefficient of thermal expansion substantially the same as the material of said side wall.

12. An enclosure for electrical circuits comprising:
(a) a housing having a bottom and side wall integral with each other, said bottom having a portion formed of the same material as the side wall and having a plurality of apertures defined therein,
(b) a material having a high thermal conductivity relative to said housing disposed in said apertures and joined to said portion of the bottom of the same material as the side wall, said side wall being formed of Kovar and said material having a high thermal conductivity being formed of copper, and
(c) a cover forming a top of said housing joined to said housing, said enclosure further including an electrically conducting terminal extending through said side wall and sealed thereto by a material having a coefficient of thermal expansion substantially the same as the material of said side wall and an electrically conducting terminal extending through the portion of said bottom of the same material as said side wall and sealed thereto by a material having a coefficient of thermal expansion substantially the same as the material of said side wall.

13. An enclosure for electrical circuits comprising:
(a) a housing having a bottom and side wall integral with each other, said bottom having a portion formed of the same material as the side wall and having a plurality of apertures defined therein,
(b) a material having a high thermal conductivity relative to said housing disposed in said apertures and joined to said portion of the bottom of the same material as the side wall, and
(c) a cover forming a top of said housing joined to said housing, the cover being formed of Kovar and welded to said side wall, said enclosure further including an electrically conducting terminal extending through said side wall and sealed thereto by a material having a coefficient of thermal expansion substantially the same as the material of said side wall and an electrically conducting terminal extending through the portion of said bottom of the same material as said side wall and sealed thereto by a material having a coefficient of thermal expansion substantially the same as the material of said side wall.

* * * * *